United States Patent [19]

Takenaka

[11] Patent Number: 5,043,049

[45] Date of Patent: Aug. 27, 1991

[54] METHODS OF FORMING FERROELECTRIC THIN FILMS

[75] Inventor: Kazuhiro Takenaka, Suwa, Japan

[73] Assignee: Seiko Epson Corporation, Japan

[21] Appl. No.: 469,179

[22] Filed: Jan. 24, 1990

[30] Foreign Application Priority Data

| Jan. 26, 1989 | [JP] | Japan | 1-17218 |
| Jan. 27, 1989 | [JP] | Japan | 1-18710 |
| Jan. 27, 1989 | [JP] | Japan | 1-18711 |
| Feb. 8, 1989 | [JP] | Japan | 1-28942 |

[51] Int. Cl.$^5$ ............................................. C23C 14/34
[52] U.S. Cl. .............................. 204/192.15; 204/192.2; 427/38; 250/492.1
[58] Field of Search .................... 204/192.15, 192.14, 204/192.18, 192.22, 192.26, 192.31; 427/38, 42; 250/492.1, 492.2, 492.3

[56] References Cited

U.S. PATENT DOCUMENTS

| 3,646,527 | 2/1972 | Wada et al. | 340/173 R |
| 3,666,665 | 5/1972 | Chapman et al. | 204/192.2 X |
| 3,681,226 | 8/1972 | Vazel | 204/192.2 |
| 3,832,700 | 8/1974 | Wu et al. | 340/173.2 |
| 4,149,302 | 4/1979 | Cook | 29/25.42 |
| 4,437,139 | 3/1984 | Howard | 361/313 |
| 4,713,157 | 12/1987 | McMillan et al. | 204/192.11 |

FOREIGN PATENT DOCUMENTS 3053264  3/1988  Japan ............................ 204/192.18

OTHER PUBLICATIONS

R. N. Castellano et al., "Ion-Beam Deposition of Thin Films of Ferroelectric Lead Zirconate Titanate (PZT)", *Journal of Applied Physics*, vol. 50 (6), pp. 4406–4411, Jun., 1979.

R. N. Castellano et al., "Ion-Beam Deposition of Ferroelectric Thin Films Sputtered From Multicomponent Targets", *Journal of Vacuum Science Technology*, vol. 17 (2), pp. 629–633, Mar./Apr., 1980.

*Primary Examiner*—Nam X. Nguyen
*Attorney, Agent, or Firm*—W. Douglas Carothers, Jr.

[57] ABSTRACT

A ferroelectric film is deposited that has desired stoichiometric composition by employing one of two methods: One method comprises depositing a ferroelectric film, e.g., $PbTiO_3$, followed by ion implanting the deposited ferroelectric film with one of the constitutents or elements comprising the film, such as, Pb, Ti or $O_2$. The other method comprises depositing the film by sputtering employing a sputtering gas medium or atmosphere that includes either $O_3$ or a gaseous form of Pb, such as $Pb(C_2H_5)_4$, $PbCl_4$, and $Pb_2O(OH)_2$, followed by annealing.

39 Claims, 3 Drawing Sheets

"5,043,049"

METHODS OF FORMING FERROELECTRIC THIN FILMS

BACKGROUND OF THE INVENTION

This invention relates generally to methods of forming thin films in manner to obtain desired stoichiometric composition and more particularly to methods of forming ferroelectric thin films having proper stoichiometric composition and excellent crystalline quality.

Generally, MIS type transistors, e.g. MISFETs, have been employed in nonvolatile ROM semiconductor memories, such as, EPROM (Electrically Programmable Read Only Memory) and EEPROM (Electrically Erasable Programmable Read Only Memory). MISFETs function by utilizing a change in the density of the surface charge on the substrate surface immediately beneath the insulator gate film which is retained for a relatively long period of time. This retention ability is brought about by introducing electric charge from the substrate into traps or trap centers in the insulator gate film of the device. An example of such memory devices is disclosed in U.S. Pat. No. 3,646,527. These nonvolatile memories, however, have certain undesirable properties, such as, a relatively high operational voltage levels for read/write functions, for example, about 20 v, and have comparatively high read/write access times, e.g., several tens microseconds in the case of an EEPROM, particularly when compared with the access times of volatile DRAMs and SRAMs. Also, the number of times of read/write functional switching is smal, limited to approximately $10^5$ times, thereby rendering such memories of limited lifetime utility.

Nonvolatile ferroelectric type memory semiconductor structures have been proposed having an electrically polarizable ferroelectric layer. These structures utilize the remanent polarization properties of the ferroelectric layer to represent, for example, a binary state, which state is maintain after power has been removed from the circuit. Since the read/write access time and total switching lifetime capacity for nonvolatile ferroelectric memory semiconductor structures is theoretically the same as the above mentioned nonvolatile ROM semiconductor memories, nonvolatile ferroelectric type memory semiconductor structures have the potential to provide a fairly ideal nonvolatile memory structure. For this reason, more attention has been recently directed toward the development of these memory structures.

Examples of nonvolatile ferroelectric type memory devices are disclosed in U.S. Pat. No. 4,149,302, illustrating a plurality of integrated capacitors comprised of an ferroelectric alloy formed on silicon substrate, and in U.S. Pat. No. 3,832,700, illustrating a nonvolatile ferroelectric memory device utilizing a ferroelectric film in place of the insulator gate of a conventional MIS type transistor.

Ferroelectric layers may be deposited by several different methods such as by sputtering, vapor deposition or the like. A popular method of deposition is rf sputtering, such as, disclosed in U.S. Pat. No. 4,437,139 wherein ferroelectric films are deposited at comparatively lower temperatures employing rf sputtering to form amorphous thin films which are thereafter rendered crystalline upon subsequent annealing.

In reality, however, present day nonvolatile ferroelectric type memories have not been of much practical utility because it is difficult to deposit or form ferroelectric thin films that are sufficiently stable. More importantly, their formation to produce a stoichiometric composition of the deposited ferroelectric alloy, such as by rf sputtering, is difficult to obtain in actual practice. For example, where PZT ($PbTiO_3/PbZrO_3$) is employed as a ferroelectric film in a memory circuit and the film is produced by rf sputtering, there results an oxide of three elements rather than a desired stoichiometric composition, i.e., the ratio of Pb, Ti, and Zr in the sputtered film does not match the stoichiometric composition thereof. The common procedure for coping with this problem is to add several percent more of the compound, PbO, to the sintered PZT target. Very often, however, the stoichiometric computational ratio is not maintained or ultimately achieved due to the fact that the proper stoichiometric ratios established at the target material do not physically translate via sputtering to the deposited ferroelectric film. Thus, the formed ferroelectric film is an aberration of the stoichiometric target material.

Further, $O_2$ is often used as or in the sputtering gas medium or atmosphere. However, depending upon the conditions employed for controlling the sputtering process, it frequently occurs that insufficient amounts of $O_2$ are incorporated in the deposited film so that deposited film is not stoichiometric.

It is an object of the present invention to provide for a method of depositing ferroelectric type films that have excellent stability and certain excellent stoichiometric composition.

SUMMARY OF THE INVENTION

According to this invention, a ferroelectric film is deposited that has desired stoichiometric composition by employing one of two methods: One method comprises depositing a ferroelectric film, e.g., $PbTiO_3$, followed by ion implanting the deposited ferroelectric film with one of the constituents or elements comprising the film, such as, Pb, Ti or $O_2$. The other method comprises depositing a ferroelectric film by sputtering employing a sputtering gas medium or atmosphere that includes either $O_3$ or a gaseous form of Pb, such as $Pb(C_2H_5)_4$, $PbCl_4$, and $Pb_2O(OH)_2$, followed by annealing.

One method of this invention involves the depositing a ferroelectric thin film containing stoichiometric composition of the constituents comprising a ferroelectric compound, such as, $PbTiO_3$, PZT ($PbTiO_3/PbZrO_3$), or PLZT ($La/PbTiO_3/PhZrO_3$), and comprises the steps of forming a ferroelectric thin film on a substrate of supporting layer from a target comprising a stoichiometric ferroelectric compound, implanting the ferroelectric film with at least one of the constituents or elements comprising the ferroelectric compound, such as Pb, Ti, Zr, or $O_2$, and thereafter annealing the ferroelectric film to form crystalline ferroelectric material whereby the ferroelectric film contains the stoichiometric composition of the ferroelectric compound.

Another method of this invention involves the depositing a ferroelectric thin film containing stoichiometric composition of the constituents comprising a ferroelectric compound, such as, $PbTiO_3$, PZT ($PbTiO_3/PhZrO_3$), or PLZT ($La/PbTiO_3/PbZrO_3$), and comprising the steps of providing a sputtering system containing a target having a stoichiometric composition of a ferroelectric compound or combination of ferroelectric compounds, introducing into the system a sputtering gas medium including ozone or the gaseous vapor of Pb, and sputtering a ferroelectric thin film on a substrate or supporting layer.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1A:
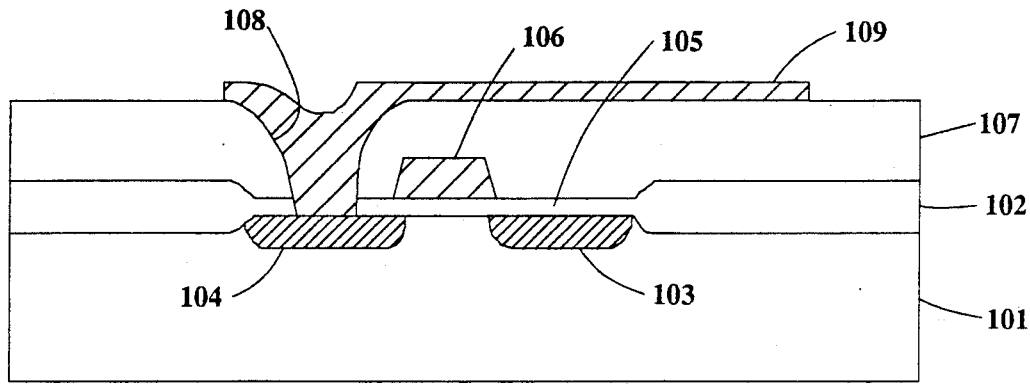
FIGS. 1A, 1B and 1C illustrate a ferroelectric semiconductor structure formed by one method comprising this invention.
Figure 1B:
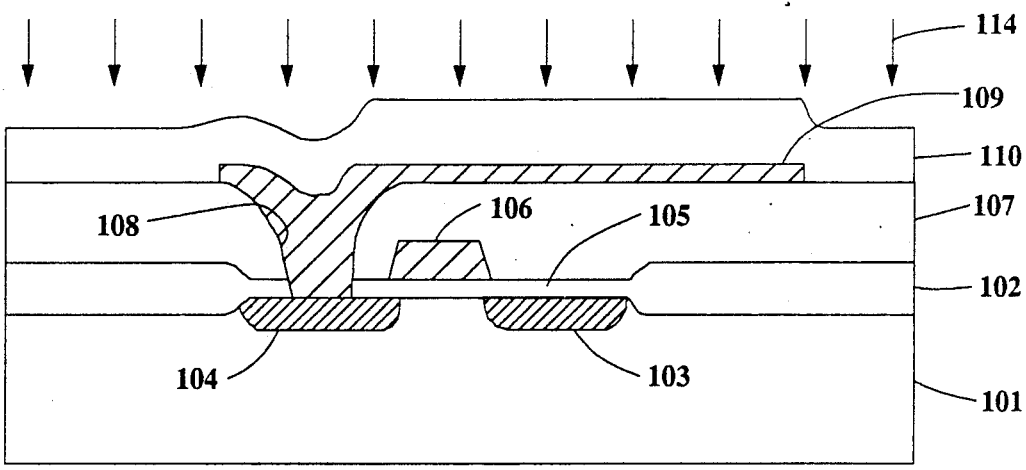
Figure 1C:
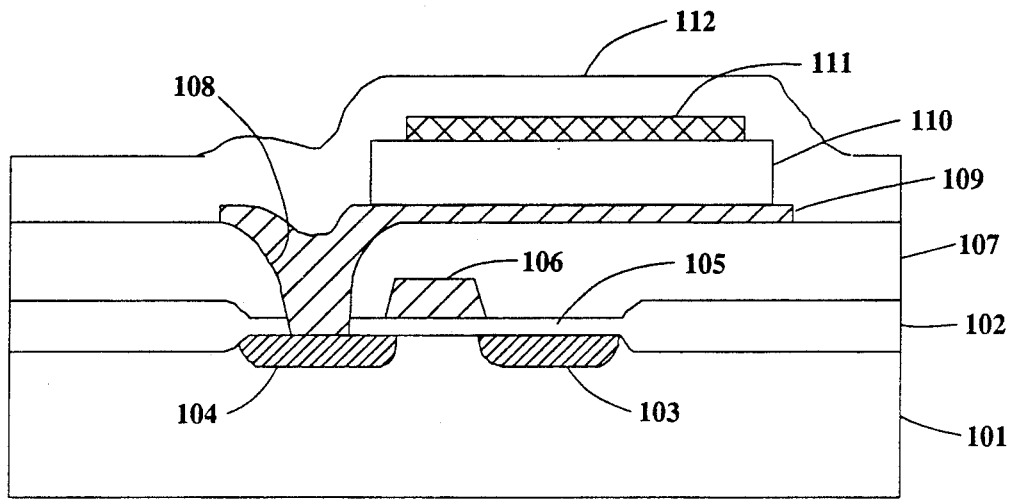

Reference is now made to FIGS. 1A-1C wherein there is disclosed a ferroelectric structure comprising an n channel MOSFET with an integrated ferroelectric storage device formed by one method of this invention. As shown in FIG. 1A, insulating film 102, such as $SiO_2$, is formed on p-Si substrate 101 having for example, a resistivity of, for example, 20 Ω cm. Film 102 is formed, such as by the conventional LOCOS method, and may have a thickness of about 6000 Å. Film 102 is employed for isolating circuit elements as is well known in the art. Oxide gate film region 105 is then formed by thermal annealing to a thickness of about 300 Å. Next, gate electrode 106, comprised of, for example, polysilicon is deposited to a thickness of about 4000 Å and thereafter patterned to form the shape as shown. Next, drain and source regions 103 and 104 are formed by a n-type diffusion with polycrystalline silicon gate electrode 106 functioning as a mask. Diffusions 103 and 104 are formed, for example, by ion implantation with an n-type dopant, such as phosphorous having a concentration of $4 \times 10^{15}/cm^2$. The implant will penetrate through film 105 to form regions 103 and 104. Interlayer insulating film 107, comprising, for example, $SiO_2$, is then deposited by vapor deposition over the structure to isolate gate electrode 106 and subsequently formed electrode 109. Film 107 may have a thickness, for example, of about 6000Å. Next, a contact hole 108 is selectively etched through films 107 and 105 for connecting source region 104 to subsequently formed electrode 109. The foregoing FIG. 1A structure represents a conventional manufacturing technique employed for MOSFET structures.

Electrode 109 is then formed and pattern by photolithography on film 107 and may be comprised of sputtered Al or Pt having a thickness, for example, of about 1 μm. Electrode 109 will also form the bottom electrode for the ferroelectric storage device integral with the formed MOSFET structure therebeneath. The prescribed pattern for bottom electrode 109 may be formed either after the deposition of ferroelectric film 110 in combination therewith or after deposition of subsequently formed top electrode 111 together with both film 110 and electrode 111.

With reference to FIG. 1B, ferroelectric film 110 is formed, for example, by rf sputtering and may be comprised of, for example, $PbTiO_3$, and have a thickness of about 5000 Å. The film growth rate obtained was 500 Å/min. when sputtering was performed under a sputtering gas environment of 50% Ar and 50% $O_2$ with a sputtering gas pressure of 5 mTorr and a rf power of 500W. The target employed in the sputtering system comprises a stoichiometric composition of $PbTiO_3$. However, the incorporation of these elements is not stoichiometric at the sample. Pb, for example, is presented at the structure shown in FIG. 1B in an amount below that required for stoichiometric composition. Film 110 is brought toward full stoichiometry by ion implant of a species of film 110, e.g., ion implant of Pb.

Thus, ferroelectric film 110 is implanted, as indicated by arrows 114 in FIG. 1B, with a constituent or element of the deposited ferroelectric film, such as, for example, implanted with Pb. The implant may be conducted at an energy level of 100 KeV at a concentration of $5 \times 10^{15}/cm^2$. For deeper penetration of implant depth, the acceleration energy, for example, may be increased to 200 KeV. After the Pb implant of film 110, the structure is annealed, for example, in an atmosphere of $N_2$ at a temperature of about 550° C. for a period of about one hour.

Ferroelectric film 110 may then be formed to a prescribed pattern employing conventional photolithography techniques. Afterwards, top electrode 111 is formed, for example, by sputtering a layer of Al on film 110. Electrode 111 may have a thickness of about 5000 Å. Lastly, as shown in FIG. 1C, passivation film 112, for example, $Si_3N_4$, is deposited by plasma CVD completing the ferroelectric memory structure.

According to the method in this invention, stoichiometric composition may be employed as the target material, and any aberration from the deposited stoichiometric composition can be corrected by subsequent ion implantation employing a constituent of the deposited ferroelectric film 110 as the implant species thereby achieving a deposited ferroelectric thin film of stoichiometric composition. Ferroelectric film 110 rendered amorphous by ion implantation treatment. Thus, a subsequent anneal process provides a ferroelectric film having excellent crystalline quality and improved data retention properties over a longer period of time compared to ferroelectric type memories of the prior art. Also, the write/read lifetime switching capability was approximately $10^7$ times compared to $10^5$ times found in prior art ferroelectric structures.

Relative to the constituents or elements for ion implantation treatment, the other elements forming ferroelectric film 110, i.e., Ti and $O_2$, may also be employed as implant species. Also, combinations of two or three of these elements, e.g., Pb and $O_2$ (in an Ar environment) may be employed as implant species. Further, $PbTiO_3$, PZT ($PbTiO_3/PbZrO_3$), or PLZT ($La/PbTiO_3/PbZrO_3$) may also be deposited as ferroelectric film 110 with any one or more of their constituents forming the implant species after deposition of the film.

Also, it is noted that in the formation of ferroelectric film 110 that if the sputtering atmosphere comprises $O_3$ or contains $O_3$, the quality of stoichiometric composition of the deposited film 110 is improved.

Lastly, it is not a requirement that the target material be an exact stoichiometric composition as employed int he example above. In such a case, fulfillment toward a stoichiometric film may be achieved in the employment of the subsequently applied ion implant treatment.

Figure 2:
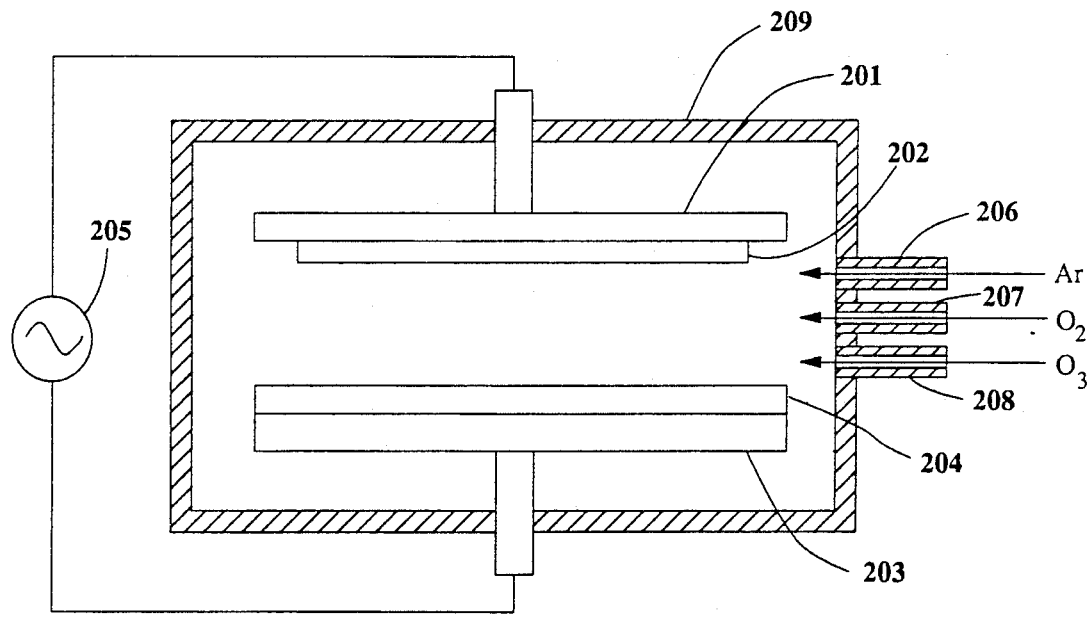
FIG. 2 schematically illustrates a first sputtering system employed for practicing a first form of the other method comprising this invention.

FIG. 2 shows a cross sectional schematic view of a sputtering system for practicing a first form of another method comprising this invention. The sputtering system comprises upper and lower electrodes 201 and 203 supported in opposed relationship in chamber 209. These electrode 201 and 203 are connected across rf source 205. A silicon wafer 202 is supported on upper electrode 201 and a sintered target 204, comprising a stoichiometric composition of a ferroelectric compound or combination of ferroelectric compounds to be deposited on wafer 202, is supported on lower electrode 203. Sintered target 204 may, for example, be comprised of PZT ($PbZrO_3$: 65% and $PbTiO_3$: 35%). A suitable exhaust (not shown) is provided for the system. As a sputtering medium or atmosphere, conventional Ar and $O_2$ are supplied through inlets 206 and 207. However, in accordance with the teachings of this invention, ozone or $O_3$ is also supplied into chamber 209 via inlet 208. The ratio of the three gases as an example may be Ar:$O_2$:$O_3$ = 80:15:5. The reaction of $O_3$ in this atmosphere is very high so that during sputtering of target 204, there is no occurrence of a lack of oxygen incorporated into the deposited ferroelectric film resulting in an imbalance in its stoichiometric composition. Further, a subsequent annealing treatment at, for example, about 500° C. or more, will further improve the crystalline quality of the deposited ferroelectric film. As an example, the annealing may be at a temperature between 500° C. to 900° C. for a period of time in excess of 30 minutes.

Further, adequate incorporation of oxygen to achieve stoichiometric composition may also achieved by forming the ferroelectric film using a sputtering medium comprising Ar and $O_2$ and thereafter annealing the film in an atmosphere containing $O_3$, e.g., 90% $O_2$ and 10% $O_3$, at a temperature, for example, at about 500° C. or more. As an example, the annealing may be at a temperature between 500° C. to 900° C. for a period of time in excess of 30 minutes. Also, the annealing atmosphere may be a combination of Ar, $O_2$ and $O_3$.

Rapid thermal annealing, e.g., lamp annealing, may also be employed in the case of annealing after depositing of the ferroelectric film either in a neutral atmosphere. such as Ar, or in an $O_3$ atmosphere. The annealing time may be one minute or more and the applied temperature in excess of 500° C.

Figure 3:
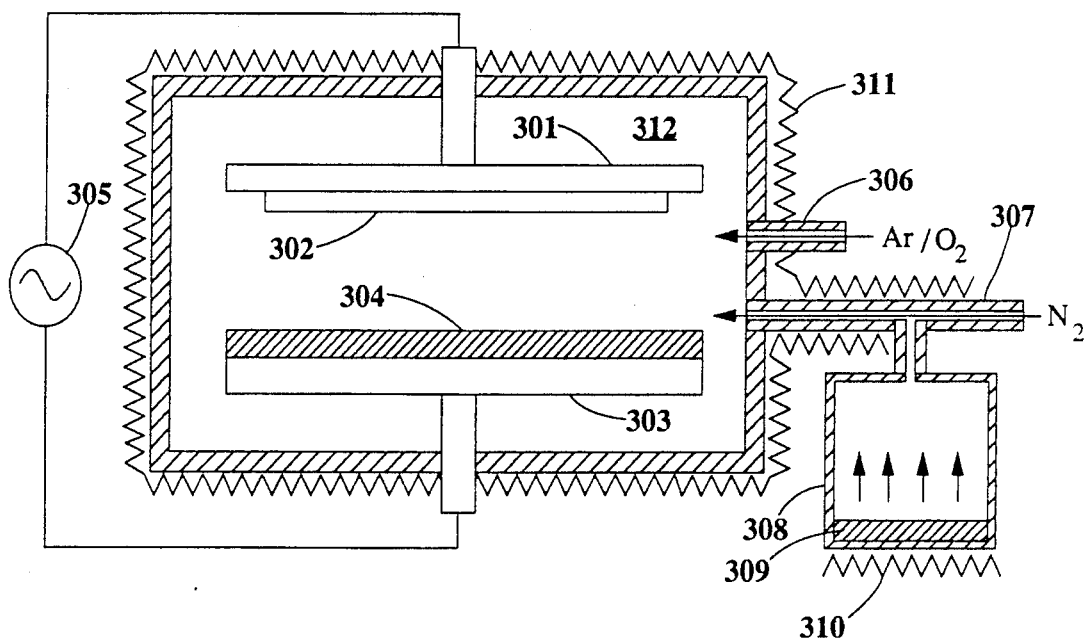
FIG. 3 schematically illustrates a second sputtering system employed for practicing a second form of the other method comprising this invention.

FIG. 3 shows a cross sectional schematic view of a modified sputtering system for practicing a second form of the method of this invention. The sputtering system comprises upper and lower electrodes 301 and 303 supported in opposed relationship in chamber 309. These electrode 301 and 303 are connected across rf source 305. A silicon wafer 302 is supported on upper electrode 301 and a sintered target 304, comprising a stoichiometric composition of a ferroelectric compound or combination of ferroelectric compounds to be deposited on wafer 302, is supported on lower electrode 303. Sintered target 304 may, for example, be comprised of $PbTiO_3$. A suitable exhaust (not shown) is provided for the system. As a sputtering medium or atmosphere, conventional Ar and $O_2$ are supplied via inlet 306 in a ratio of 90% Ar and 10% $O_2$. In accordance with the teachings of this method, the vapor of a chemical compound containing Pb in addition to the argon/oxygen sputtering medium at 306 is introduced via gas inlet 307. The examples of chemical compounds containing Pb that may be employed in this method are $Pb(C_2H_5)_4$, $PbCl_4$, and $Pb_2O(OH)_2$ having respective boiling points of 200° C., 105° C., and 145° C. As a result, these gaseus compounds cannot be introduced at room temperature. Thus, for example, in the case where $PbCl_4$ is employed, this Pb compound 309 is placed within heating chamber 308 heated by heater 310. The $PbCl_4$ compound is vaporized and introduced into sputtering chamber 312 via a carrier gas, such as $N_2$ through inlet 307. Heater 311 surrounds chamber 312 and heats sputtering chamber 312 to 200° C., the boiling point of $PbCl_4$. The percentage ratio of sputtering gases for Ar/$O_2$/$N_2$ in the case of $PbCl_4$ may be about 85%/10%/5%. An ferroelectric film of excellent stoichiometric composition is achieved by sputtering when target 304 of stoichiometric composition of $PbTiO_3$ is employed with rf power set at 200W and a substrate temperature provided at about 500° C. When the electrical characteristics of such ferroelectric films were evaluated, it was determined that the write/read lifetime switching capability was improved from the prior art standard of around $10^5$ to about $10^7$.

While the invention has been described in conjunction with several specific embodiments, it is evident to those skilled in the art that many further alternatives, modifications and variations will be apparent in light of the forgoing description. For example, the application of this invention also may be applied to bipolar technology as well as CMOS technology and combination bipolar/CMOS technology. Further, the substrate may, for example, be GaAs and the ferroelectric films maybe applied in structures containing III-V compound layers such as GaAs and AlGaAs. Thus, the invention described herein is intended to embrace at such alternatives, modifications, applications and variations as fall within the spirit and scope of the appended claims.

What is claimed is:

1. A method of depositing a ferroelectric thin film on a substrate or supporting layer to contain a stoichiometric composition of the constituents comprising a ferroelectric compound and comprising the steps of forming a ferroelectric thin film comprising ferroelectric constituents of said compound on said substrate or supporting layer, subsequently implanting said ferroelectric film with at least one of said ferroelectric constituents to render said deposited film stoichiometric whereby said ferroelectric film contains the stoichiometric composition of said ferroelectric compound and is rendered amorphous, thereafter annealing said ferroelectric film to form a crystalline ferroelectric film.

2. The method of claim 1 wherein said ferroelectric film comprises $PbTiO_3$, PZT ($PbTiO_3$/$PbZrO_3$), or PLZT (La/$PbTiO_3$/$PbZrO_3$).

3. The method of claim 1 wherein said annealing step is carried out for about one hour at a temperature of about 500° C. or more.

4. The method of claim 1 wherein said step of annealing comprises thermal annealing of said ferroelectric film at a temperature in excess of 500° C. for a minute or more.

5. The method of claim 1 wherein said annealing step is carried out in an atmosphere containing ozone.

6. A method of depositing a ferroelectric thin film on a substrate or supporting layer to contain a stoichiometric composition of the constituents comprising a ferroelectric compound and comprising the steps of providing a sputtering system containing a target having a stoichiometric composition of a ferroelectric compound or combination of ferroelectric compounds.

sputtering a ferroelectric thin film comprising ferroelectric constituents of said compound on said substrate or supporting layer, subsequently implanting said ferroelectric film with at least one of said ferroelectric constituents to render said deposited film stoichiometric whereby said ferroelectric film contains the stoichiometric composition of said ferroelectric compound and is rendered amorphous, thereafter annealing said ferroelectric film to form a crystalline ferroelectric film.

7. The method of claim 6 wherein said ferroelectric film comprises $PbTiO_3$, PZT ($PbTiO_3/PbZrO_3$), or PLZT ($La/PbTiO_3/PbZrO_3$).

8. The method of claim 6 wherein said annealing step is carried out for about one hour at a temperature of about 500° C. or more.

9. The method of claim 6 wherein said step of annealing comprises thermal annealing of said ferroelectric film at a temperature in excess of 500° C. for a minute or more.

10. The method of claim 6 wherein said annealing step is carried out in an atmosphere containing ozone.

11. A method of depositing a ferroelectric thin film on a substrate or supporting layer to contain a stoichiometric composition of the constituents comprising a ferroelectric compound and comprising the steps of providing a sputtering system containing a target having a stoichiometric composition of a ferroelectric compound or combination of ferroelectric compounds.

introducing into said system a sputtering gas medium including ozone, sputtering a ferroelectric thin film comprising ferroelectric constituents of said compound on said substrate or supporting layer, subsequently implanting said ferroelectric film with at least one of said ferroelectric constituents to render said deposited film stoichiometric whereby said ferroelectric film contains the stoichiometric composition of said ferroelectric compound and is rendered amorphous, thereafter annealing said ferroelectric film to form a crystalline ferroelectric film.

12. The method of claim 11 wherein said ferroelectric film comprises $PbTiO_3$, PZT ($PbTiO_3/PbZrO_3$), or PLZT ($La/PbTiO_3/PbZrO_3$).

13. The method of claim 11 wherein said annealing step is carried out for about one hour at a temperature of about 500° C. or more.

14. The method of claim 11 wherein said step of annealing comprises thermal annealing of said ferroelectric film at a temperature in excess of 500° C. for a minute or more.

15. The method of claim 11 wherein said annealing step is carried out in an atmosphere containing ozone.

16. A method of depositing a ferroelectric thin film on a substrate or supporting layer to contain a stoichiometric composition of the constituents comprising a ferroelectric compound and comprising the steps of providing a sputtering system containing a target having a stoichiometric composition of a ferroelectric compound or combination of ferroelectric compounds, introducing into said system a sputtering gas medium, sputtering a ferroelectric thin film on said substrate or supporting layer, and annealing said ferroelectric film in an atmosphere containing $O_3$ to achieve stoichiometric composition and to form crystalline ferroelectric material.

17. The method of claim 16 wherein said ferroelectric film comprises $PbTiO_3$, PZT ($PbTiO_3/PbZrO_3$), or PLZT ($La/PbTiO_3/PbZrO_3$).

18. The method of claim 16 wherein said annealing step is carried out for about one hour at a temperature of about 500° C. or more.

19. The method of claim 16 wherein said sputtering gas medium comprises Ar and $O_2$.

20. The method of claim 16 wherein said annealing atmosphere contains at least 5% ozone.

21. A method of depositing a ferroelectric thin film on a substrate or supporting layer to contain a stoichiometric composition of the constituents comprising a ferroelectric compound and comprising the steps of providing a sputtering system containing a target having a stoichiometric composition of a ferroelectric compound or combination of ferroelectric compounds, introducing into said system a sputtering gas medium including ozone, and sputtering a ferroelectric thin film on said substrate or supporting layer.

22. The method of claim 21 wherein said ferroelectric film comprises $PbTiO_3$, PZT ($PbTiO_3/PbZrO_3$), or PLZT ($La/PbTiO_3/PbZrO_3$).

23. The method of claim 21 including the step of annealing said ferroelectric film.

24. The method of claim 23 wherein said annealing step is carried out for about one hour at a temperature of about 500° C. or more.

25. The method of claim 21 wherein said sputtering gas medium contains about 5% ozone.

26. The method of claim 21 wherein said sputtering gas medium comprises Ar, $O_2$ and $O_3$.

27. The method of claim 26 wherein the ratio of Ar:$O_2$:$O_3$ is about 80:15.5.

28. A method of depositing a ferroelectric thin film on a substrate or supporting layer to contain a stoichiometric composition of the constituents comprising a ferroelectric compound and comprising the steps of providing a sputtering system containing a target having a stoichiometric composition of a ferroelectric compound or combination of ferroelectric compounds, introducing into said system a sputtering gas medium including a vapor medium comprising an alkyl metal organic form, a hydride form or a halide form of Pb, and sputtering a ferroelectric thin film on said substrate or supporting layer, thereafter annealing said ferroelectric film.

29. The method of claim 28 wherein said ferroelectric film comprises $PbTiO_3$, PZT ($PbTiO_3/PbZrO_3$), or PLZT ($La/PbTiO_3/PbZrO_3$).

30. The method of claim 28 wherein said annealing step is carried out for about one hour at a temperature of about 500° C. or more.

31. The method of claim 28 wherein the percent of said Pb gaseous vapor in said sputtering gas medium is at least 5%.

32. The method of claim 28 wherein said sputtering gas medium contains $Pb(C_2H_5)_4$, $PbCl_4$, $Pb_2O(OH)_2$.

33. The method of claim 28 wherein said sputtering gas medium comprises Ar, $O_2$ and $Pb(C_2H_5)_4$, $PbCl_4$, or $Pb_2O(OH)_2$.

34. The method of claim 33 wherein the percentage ratio of Ar, $O_2$ and $Pb(C_2H_5)_4$, $PbCl_4$, or $Pb_2O(OH)_2$ is about 85%/10%/5%.

35. A method of depositing a ferroelectric thin film on a substrate or supporting layer to contain a stoichiometric composition of the constituents comprising a ferroelectric compound and comprising the steps of
    providing a sputtering system containing a target having a stoichiometric composition of $PbTiO_3$, PZT ($PbTiO_3/PbZrO_3$), or PLZT (La/$PbTiO_3/PbZrO_3$),
    introducing into said system a sputtering gas medium comprising Ar, $O_2$ and $Pb(C_2H_5)_4$, $PbCl_4$, or $Pb_2O(OH)_2$, and
    sputtering a ferroelectric thin film on said substrate or supporting layer.

36. The method of claim 35 wherein said $Pb(C_2H_5)_4$, $PbCl_4$, or $Pb_2O(OH)_2$ is at least 5% of said sputtering gas medium.

37. The method of claim 35 wherein the percentage ratio of Ar, $O_2$ and $Pb(C_2H_5)_4$, $PbCl_4$, or $Pb_2O(OH)_2$ is about 85%/10%/5%.

38. A method of depositing a ferroelectric thin film on a substrate or supporting layer to contain a stoichiometric composition of the constituents comprising a ferroelectric compound and comprising the steps of
    providing a sputtering system containing a target having a stoichiometric composition of a ferroelectric compound or combination of ferroelectric compounds,
    introducing into said system a sputtering gas medium comprising Ar and $O_2$,
    sputtering a ferroelectric film on said substrate or supporting layer, and
    thereafter annealing said ferroelectric film to form a crystalline ferroelectric film in an atmosphere containing reactive $O_3$ wherein $O_3$ is a secondary component in said atmosphere, said annealing carried out at a temperature in the range of 500° C. to 900° C.

39. The method of claim 38 wherein said atmosphere comprises 90% $O_2$ and 10% $O_3$.

* * * * *